United States Patent [19]

Smith et al.

[11] Patent Number: 4,782,350

[45] Date of Patent: Nov. 1, 1988

[54] AMORPHOUS SILICON VARACTORS AS RF AMPLITUDE MODULATORS AND THEIR APPLICATION TO ACOUSTIC INK PRINTERS

[75] Inventors: Donald L. Smith, Palo Alto; Scott A. Elrod, Menlo Park, both of Calif.

[73] Assignee: Xerox Corporation, Stamford, Conn.

[21] Appl. No.: 114,182

[22] Filed: Oct. 28, 1987

[51] Int. Cl.[4] ............................................. G01D 15/16
[52] U.S. Cl. .................................. 346/140 R; 310/317; 332/56; 361/281
[58] Field of Search ................ 346/140, 1.1; 310/317, 310/316; 361/281; 332/56; 331/154, 158, 177 V

[56] References Cited

U.S. PATENT DOCUMENTS

| 2,990,522 | 6/1961 | Riebman | 332/56 X |
| 3,170,126 | 2/1965 | Bento | 332/56 X |
| 3,622,914 | 11/1971 | Chung | 332/56 |
| 4,308,547 | 12/1981 | Lovelady et al. | 346/140 |
| 4,697,195 | 9/1987 | Quate | 346/140 |

Primary Examiner—Joseph W. Hartary

[57] ABSTRACT

Amorphous silicon (aSi) voltage-controlled, variable capacitors (varactors) are utilized as rf amplitude modulators, such as for amplitude modulating the rf applied to an acoustic ink printhead. Large area fabrication processes are employed for vertically integrating these varactors with such printheads or other devices.

20 Claims, 6 Drawing Sheets

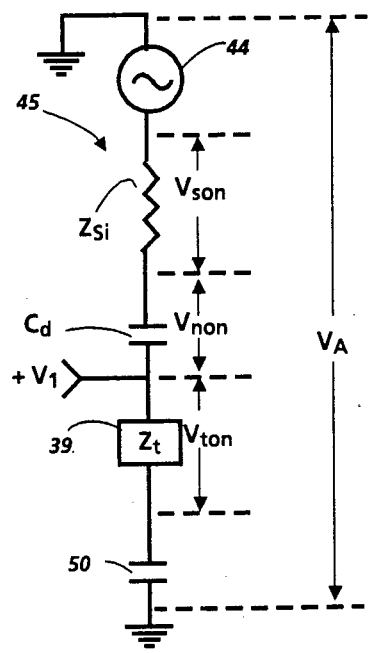
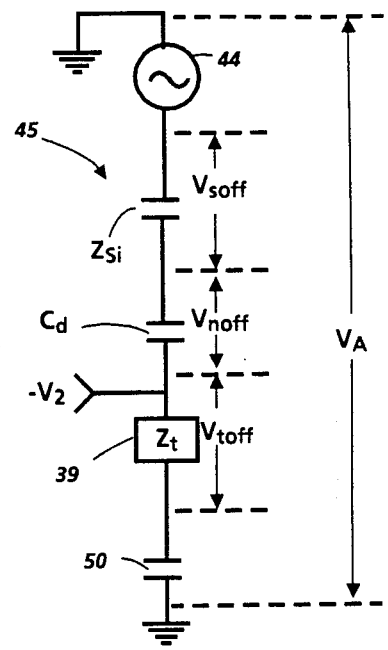
FIG. 5A  FIG. 5B
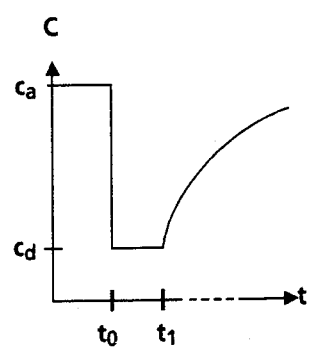
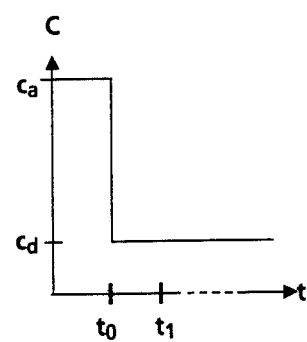
FIG. 6A  FIG. 6B

AMORPHOUS SILICON VARACTORS AS RF AMPLITUDE MODULATORS AND THEIR APPLICATION TO ACOUSTIC INK PRINTERS

FIELD OF THE INVENTION

This invention relates to rf amplitude modulators and, more particularly, to varactors for amplitude modulating rf signals, such as the rf excitation voltages which are used to drive the piezoelectric transducers of acoustic ink printheads.

BACKGROUND OF THE INVENTION

Acoustic ink printing is a promising direct marking technology featuring the important advantage of not requiring the nozzles or the small ejection orifices which have caused many of the reliability and pixel (i.e., picture element) placement accuracy problems that have tended to degrade the performance of conventional drop on demand and continuous stream ink jet printers.

At least two fundamentally different acoustic ink printing techniques have been proposed, so it should be understood that the one to which this invention most directly pertains involves the use of focused ultrasound for ejecting individual droplets of ink on command from the free surface (i.e., the liquid/air interface) of a pool of liquid ink, such that those droplets deposit in an image configuration on a nearby recording medium. It already has been found that acoustic ink printers having printheads comprising acoustically illuminated spherical focusing lenses can print precisely positioned pixels at resolutions which are sufficient for high quality printing of relatively complex images. See, for example, the copending and commonly assigned United States patent applications of Elrod et al, which were filed Dec. 19, 1986 under Ser. Nos. 944,490, now U.S. Pat. No. 4,751,529, 944,698, now U.S. Pat. No. 4,751,530, and 944,701 on "Microlenses for Acoustic Printing", "Acoustic Lens Arrays for Ink Printing" and "Sparse Arrays for Acoustic Printing", respectively. It also has been discovered that the size of the individual pixels that are printed by such a printer can be varied over a significant range during operation, thereby facilitating, for example, the printing of variably shaded images. See, another copending and commonly assigned United States patent application of Elrod et al, which was filed Dec. 19, 1986 under Ser. No. 944,286 on "Variable Spot Size Acoustic Printing".

Although droplet ejectors with acoustic focusing lenses currently are favored for this type of acoustic ink printing, alternatives are available; including (1) piezoelectric shell transducers, such as described in Lovelady et al U.S. Pat. No. 4,308,547, which issued Dec. 29, 1981 on a "Liquid Drop Emitter," and (2) planar piezoelectric transducers having concentric interdigitated electrodes (IDT's), such as described in a copending and commonly assigned Quate et al United States patent application, which was filed Jan. 5, 1987 under Ser. No. 946,682 now U.S. Pat. No. 4,697,195, on "Nozzleless Liquid Droplet Ejectors" as a continuation of application Ser. No. 776,291 filed Sept. 16, 1985, now abandoned. Furthermore, the existing droplet ejector technology is sufficient for designing diversely configured printheads, including (1) single ejector embodiments for raster scan printing, (2) matrix configured ejector arrays for matrix printing, and (3) several different types of pagewidth ejector arrays, ranging from (i) single row, sparse arrays for hybrid forms of parallel/serial printing to (ii) multiple row, staggered arrays with individual ejectors for each of the pixel positions or addresses within a pagewidth image field (i.e., single ejector/pixel/line) for ordinary line printing. Practical considerations can influence or even govern the choice of droplet ejectors for some printhead configurations, so the above-identified patent applications are hereby incorporated by reference to supplement this general overview.

Each of the droplet ejectors of an acoustic ink printer of the foregoing type launches a converging acoustic beam into a pool of liquid ink, typically at a near normal angle of incidence with respect to the free surface of the ink. As a general rule, the angular convergence of each beam is selected to cause it to come to focus essentially on the free ink surface. Furthermore, provision is made in such printers for modulating the radiation pressure which each beam exerts against the free surface of the ink, thereby enabling the radiation pressure produced by each beam to make brief, controlled excursions to a sufficiently high pressure level to overcome the restraining force of surface tension. As a result of these pressure excursions, individual droplets of ink are ejected from the free ink surface on command with sufficient velocity to deposit them on a nearby recording medium.

Typically, such droplet ejectors are driven by rd excited piezoelectric transducers, so the radiation pressures exerted by the acoustic beams they emit can be modulated by amplitude modulating the rf excitation voltages that are applied to their transducers. Unfortunately, however, known rf amplitude modulators generally are relatively complex and expensive devices because of the high frequency response that is required of them. Thus, there is a need for simpler and less costly rf amplitude modulators for use with acoustic ink printheads, as well as for other applications requiring the amplitude modulation of similar rf signals. For example, a basic performance specification for an amplitude modulator intended to be used in a simple acoustic ink printer might call for the modulation of a rf signal having a frequency on the order of 100–200 MHZ and a peak-to-peak voltage of about 100 volts at a peak modulation rate on the order of 100 KHz to vary the peak-to-peak amplitude of the rf voltage by about 2-10 dB as a function of the input data applied to the printer.

SUMMARY OF THE INVENTION

In accordance with the present invention, amorphous silicon voltage controlled capacitive devices (i.e., varactors) are provided for amplitude modulating rf signals, such as the rf excitation voltages that are applied to the piezoelectric transducers of acoustic ink printheads. Large area fabrication technology may be used to vertically integrate amorphous silicon varactors with such printheads.

BRIEF DESCRIPTION OF THE DRAWINGS

Still other features and advantages of this invention will become apparent when the following detailed description is read in conjunction with the attached drawings, in which:

FIGS. 5A and 5B are single channel accumulation mode and depletion mode models, respectively, of the modulator shown in FIGS. 3 and 4;

FIGS. 6A and 6B are idealized curves generally illustrating the capacitance versus time characteristics of an amorphous silicon capacitor operating with an unrefreshed and a refreshed depletion mode, respectively, with the time scale of these curves undergoing a steplike compression at time $t_1$;

DETAILED DESCRIPTION OF THE ILLUSTRATED EMBODIMENTS

While the invention is described in some detail hereinbelow with reference to certain illustrated embodiments, it is to be understood that there is no intent to limit it to those embodiments. On the contrary, the aim is to cover all modifications, alternatives and equivalents falling within the spirit and scope of the invention as defined by the appended claims.

Figure 1:
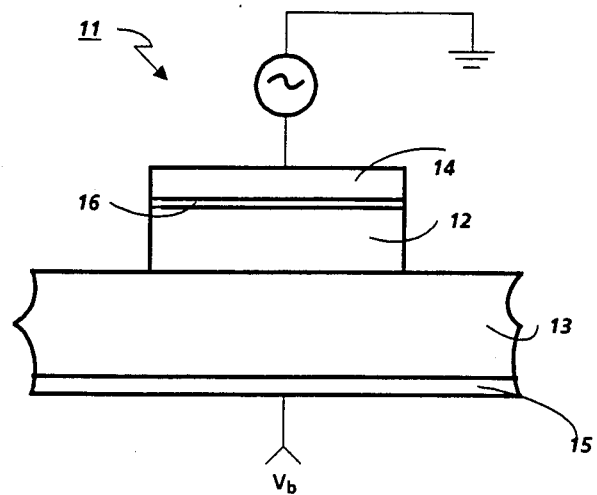
FIG. 1 is a simplified sectional view of an amorphous silicon voltage variable capacitor.

Turning now to the drawings, and at this point especially to FIG. 1, there is a more or less conventional voltage-controlled variable capacitor 11 comprising a layer of intrinsic (i.e., undoped) amorphous silicon (aSi) 12 in intimate face-to-face contact with a dielectric layer 13, such as a layer of amorphous silicon nitride (aSi$_3$N$_4$). As shown, those two layers are sandwiched between a pair of metallizations 14 and 15 to accommodate the external electrical connections to the capacitor 11. Moreover, in keeping with accepted practices, a thin n + interface layer 16 is deposited on the outer surface of the aSi layer 12, thereby increasing the electrical conductivity of the interface between the intrinsic aSi layer 12 and the metallization 14.

Figure 2:
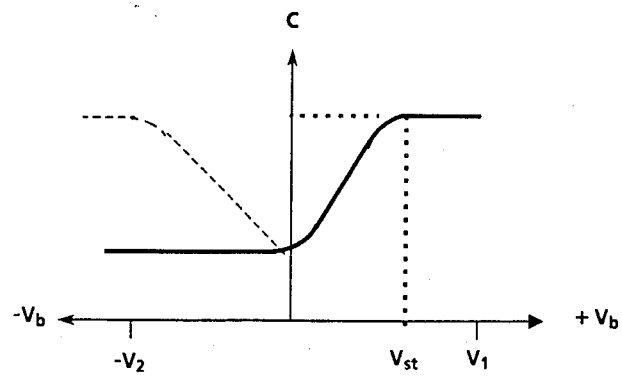
FIG. 2 is an idealized curve generally illustrating the accumulation and depletion mode capacitance versus voltage characteristics of an amorphous silicon capacitor such as shown in FIG. 1, with the inversion mode characteristics of the capacitor being depicted in phantom line.

As is known, the capacitance of a conventional aSi capacitor, such as the capacitor 11, characteristically varies as a function of the bias voltage, $V_b$, applied across it. Specifically, as depicted in FIG. 2, the capacitor 11 has a relatively high capacitance when it is positively biased into accumulation and relatively low capacitance when it is negatively biased into depletion. Substantial capacitive saturation is achievable when the capacitor 11 is operating in either its accumulation mode or its depletion mode. As a general rule, however, a positive bias in excess of a finite threshold voltage level, $V_{st}$, is required to realize capacitive saturation while the capacitor 11 is in its accumulation mode. Furthermore, given the existing state of the art, it is likely to be found that the capacitor 11 is only conditionally stable while operating in its depletion mode because such devices normally exhibit inversion mode characteristics (as indicated in phantom lines) if subjected to a negative bias for a sustained period of time (usually, a negative bias applied for only a few seconds is sufficient to produce an observable inversion effect).

Others previously have employed aSi capacitors in relatively low frequency test instruments for characterizing the quality of semiconductors and dielectrics. These applications have demonstrated that such devices behave as low frequency varactors over a substantial voltage range. Now, however, it has been found that they are suitable for use as varactors for much higher frequency applications, such as for amplitude modulating rf signals. That observation applies to aSi mesa capacitors having aSi layers 12 which are approximately 1–4 $\mu$m thick and aSi$_3$N$_4$ dielectric layers 13 which are approximately 0.1–3 $\mu$m and is believed to be of even more general applicability than that. Surprisingly, it has been discovered that the high frequency response of these varactors is vastly superior to what would be expected of them based on classical RC time constant calculations using the bulk resistivity of intrinsic aSi (roughly $10^9$ ohm-cm) and the capacitance of, for example, a 0.4 $\mu$m thick Si$_3$N$_4$ film with a dielectric constant of approximately 6–7. The low level of high frequency attenuation caused by these devices may result from electrons in shallow band states being able to traverse the thin intrinsic aSi layer 12 without being trapped, as occurs in the case of photoexcited carriers, but further experimentation beyond the scope of the present invention is required to determine whether that explanation adequately accounts for their high frequency response or not. Clearly, however, the aforementioned discovery is important, even if the detailed physics underlying it are not yet fully understood.

Figure 3:
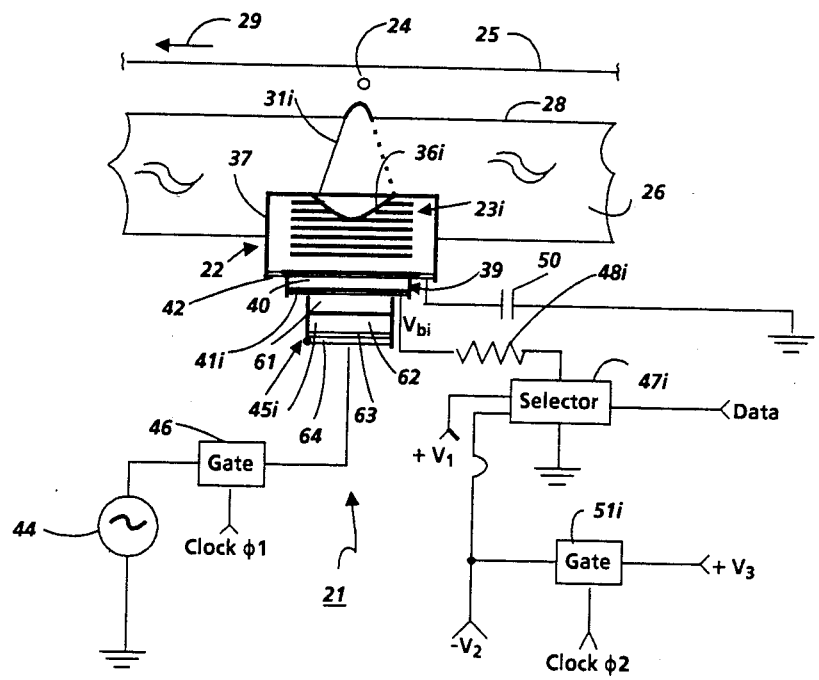
FIG. 3 is a partially sectioned, simplified transverse plane view of an acoustic ink printhead having a multichannel amorphous silicon rf modulator constructed in accordance with the present invention.
Figure 4:
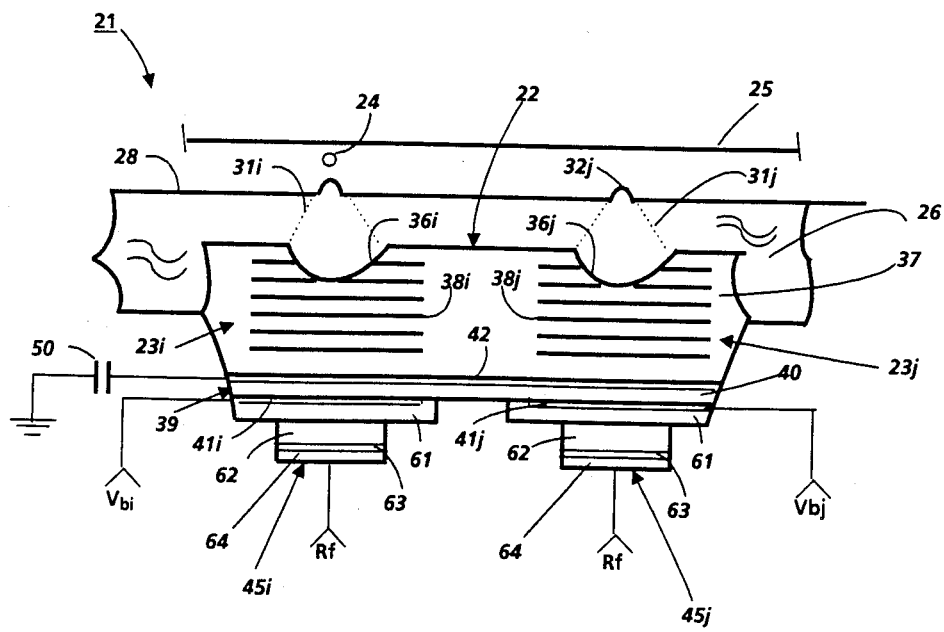
FIG. 4 is a partially sectioned, simplified tangential plane view of the printhead and modulator shown in FIG. 3.

Referring to FIGS. 3 and 4 for an example of one of the potentially significant high frequency applications for these varactors, there is an acoustic ink printer 21 (shown only in relevant part) comprising a printhead 22 having an array of droplet ejectors (two of which are shown at 23$i$ and 23$j$ in FIG. 4) for depositing individual droplets of ink 24 on command on spaced apart centers on a suitable recording medium 25. As illustrated, the droplet ejectors 23$i$ and 23$j$ are immersed in a pool of liquid ink 26, but it will be apparent that they could be acoustically coupled to the ink supply 26 via a suitable acoustic coupling medium (not shown, but which may take a variety of forms, including some in which the ink 26 is transported across the printhead 22 on a thin, plastic carrier). The recording medium 25, on the other hand, is supported (by means not shown) at a small fixed distance from the free surface 28 of the ink 26 to receive the droplets of ink 24 that are ejected therefrom. In the illustrated embodiment, the recording medium is advanced during operation at a predetermined rate (by means not shown) in a sagittal, cross-line direction relative to the printhead 22, as indicated in FIG. 3 by the arrow 29, such as for line printing by a pagewidth array of droplet ejectors. Nevertheless, it will be apparent that the relative motion between the printhead 22 and the recording medium 25 could be modified as required to accommodate different printhead configurations and different printing patterns.

In keeping with prior proposals, the droplet ejectors 23$i$ and 23$j$ launch converging acoustic beams 31$i$ and 31$j$, respectively, into the pool of ink 26 at near normal angles of incidence with respect to its free surface 28. The angular convergence of these beams causes them to come to focus on spaced apart centers essentially on the free ink surface 28. Furthermore, the acoustic radiation pressures which the beams 31i and 31j exert against the free ink surface 28 are independently modulated, as more fully described hereinbelow, thereby enabling each of the beams 31i and 31j to eject individual droplets of ink 24 therefrom on command. Ejection occurs when the radiation pressure ovecomes the restraining force of surface tension, so it will be understood that the radiation pressure exerted by each of the beams 31i and 31j suitably is modulated to vary between (i) a sub-threshold incipient pressure level which is sufficient to raise a mound of ink on the free ink surface 28, as at 32j in FIG. 4, but insufficient to cause the ejection of any ink therefrom, and (ii) a higher pressure level equal to or exceeding the droplet ejection threshold pressure.

As best shown in FIG. 4, the droplet ejectors 23i and 23j preferably comprise spherical acoustic focusing lenses 36i and 36j, respectively, which are defined by small spherical depressions or indentations that are formed on preselected centers in the anterior face (usually the upper face) of a substrate 37. The substrate 37 is the body of the printhead 22, so its configuration and the specific layout of the lenses 36i and 36j on it are dictated by the detailed functional performance characteristics of the printhead 22. Regardless, however, of the specific configuration of the printhead 22, the substrate 37 is composed of a material, such as silicon, silicon nitride, silicon carbide, alumina, sapphire, fused quartz and certain glasses, having an acoustic velocity which is substantially higher (preferably, several times higher) than the acoustic velocity of the ink 26.

During operation, the lenses 36i and 36j are more or less independently illuminated by acoustic plane waves 38i and 38j, respectively, which are coupled into the substrate 37 as a result of rf induced localized oscillations of a piezoelectric transducer 39. To that end, the transducer 39 is deposited on or otherwise intimately bonded to the posterior face of the substrate 37 (e.g., its lower face in this instance). Furthermore, to illuminate the lenses 36i and 36j, the transducer 39 is locally excited into oscillation by rf voltages that are applied across it on locally excitable centers which are positioned such that the acoustic waves 38i and 38j substantially concentrically impinge on the lenses 36i and 36j, respectively. As illustrated, the transducer 39 is composed of a piezoelectric film 40, such as a zinc oxide (ZnO) film, which is sandwiched between a set of individually addressable electrodes 41i and 41j and a counter electrode 42. Thus, the spatial positioning of the electrodes 41i and 41j determines the alignment of the locally excitable centers of the transducer 39. However, it will be evident that other piezoelectric materials and other transducer configurations, including discrete piezoelectric transducer devices, could be employed if desired.

The lenses 36i and 36j advantageously are designed to have F#'s $\approx$ 1. Moreover, in the preferred embodiments, the ratio of the refractive index of the lens substrate 37 to the refractive index of the ink 26 is sufficiently high to enable the lenses 36i and 36j to bring the beams 31i and 31j to essentially diffraction limited focii. Under those circumstances, the focused waist diameters of the acoustic beams 31i and 31j are roughly equal to the wavelength of the rf that is applied to the transducer 39, whereby the available printing resolution is substantially maximized for any given rf excitation frequency. To confirm that conclusion, it is noted that the diameter of the spot printed on the recording medium 25 by a single droplet of ink 24 is roughly twice the droplet diameter which, in turn, is approximately equal to the waist diameter of the droplet ejecting acoustic beam 31i or 31j.

In accordance with the present invention, an rf voltage source 44 is coupled in parallel across the locally excitable centers of the transducer 39 via its individually addressable electrodes 41i and 41j and series aSi capacitors 45i and 45j (both of which can be seen in FIG. 4), respectively. The transducer counter electrode 42 is returned to ground through an optional dc isolation capacitor 50, thereby establishing a rf ground for the transducer 39. A gate 46 (FIG. 3) is cyclically enabled and disabled by one phase (clock $\Phi_1$) of a clock pulse source (not shown), whereby the rf excitation voltage is applied to the transducer 39 in brief bursts at a predetermined rate of, say, 10 KHz or so, with each of those bursts being of sufficient duration to cause the ejection of a single droplet per ejector. Thus, the droplet ejection process is synchronous with the rf bursts, and the maximum achievable droplet ejection rate is determined by the burst rate. Otherwise, however, the mesa capacitors 45i and 45j control the operation of the ejectors 23i and 23j, respectively, by independently amplitude modulating the rf voltage bursts that are applied to them in accordance with the data that is to be printed by them.

Similar means may be utilized for controlling each of the droplet ejectors 23i and 23j, so the control circuitry for the ejector 23i is illustrated in some detail in FIG. 3 to provide a generally representative example. As will be seen, the input data samples for the ejector 23i are serially applied to a selector 47i which couples a positive bias voltage, $+V_1$, or a negative bias voltage, $-V_2$, across the mesa capacitor 45i depending on whether the selector 47i is responding to a data sample representing a black pixel or a white pixel, respectively (as used herein, "black and white" denote the presence and absence, respectively, of ink caused coloration, without reference to any particular spectral values). More particularly, black pixels are printed by causing the ejector 23i to eject one or more ink droplets 24, so the selector 47i applies the positive bias voltage $+V_1$ to the capacitor 45i for biasing it into accumulation in response to data samples representing those pixels. White pixels, on the other hand, are printed by suppressing the ejection of ink, so the selector 47i applies the negative bias voltage $-V_2$ to the capacitor 45i to bias it into depletion in response to data samples representing them. A series current limiting resistor 48i advantageously is provided for coupling the mesa capacitor 45i to the bias selector 47i, while inhibiting rf current from being shunted from the capacitor 45i to the selector 47i.

Turning to FIGS. 5A and 5B, it will be apparent that the peak-to-peak amplitude of the rf voltage that is dropped across the locally excitable center of the transducer 39 for the droplet ejector 23i (i.e., the "piezoelectric transducer means" of the droplet ejector 23i) is significantly greater when the mesa capacitor 45i is biased into accumulation (FIG. 5A) than when it is biased into depletion (FIG. 5B). In particular when the capacitor 45i is capacitively saturated while operating in its accumulation mode, the rf output voltage, $V_A$, of the source 44 is dropped across a series divider which, as shown in FIG. 5A, is essentially defined by the impedance $Z_t$ of the transducer 39 and the capacitive impedance $C_d$ of the dielectric layer of the mesa capacitor 45i. The impedance, $Z_{Si}$, of the aSi layer of the capacitor 45i is primarily resistive under the above conditions, so it causes only a small rf voltage drop, $V_{Son}$ (as used herein the subscripts "on" and "off" indicate whether the modulated amplitude of the rf applied to a given transducer means is high or low, respectively). Contrastingly when the capacitor 45i is capacitively saturated while in its depletion mode, the series divider across which the rf output voltage, $V_A$, of the source 44 is dropped includes, as shown in FIG. 5B, not only the aforementioned impedances $Z_t$ and $C_d$, but also the capacitive impedance $C_{Si}(C_{Si} \approx Z_{Si})$ which is then presented by the aSi layer of the capacitor 45i. This means that the switching of the capacitor 45i from its accumulation mode to its depletion mode reduces the peak-to-peak amplitude of the rf voltage that is applied to the transducer 39 by an attenuation factor, $\delta$, such that:

$$V_{toff} = (1-\delta)V_{ton} \qquad (1)$$

A comparison of the peak-to-peak voltage of the first two rf bursts 49 that are shown in FIG. 7 with the peak-to-peak voltage of the third illustrates that the data dependent switching of the mesa capacitor 45i between its accumulation and depletion modes effectively amplitude modulates the rf excitation voltage that is applied to the piezoelectric transducer means of the droplet ejector 23i in accordance with the data that is applied to its bias selector 47i. This rf amplitude modulation produces a corresponding modulation of the intensity of the acoustic beam 31i emitted by the droplet ejector 23i, thereby causing the radiation pressure which the beam 31i exerts against the free surface 28 of the ink 26 to vary between a level at least equal to the droplet ejection threshold level for the printing of black pixels and a lower, subthreshold level for the printing of white pixels, as previously described. The magnitudes of the dc bias voltages $+V_1$ and $-V_2$ are selected to be approximately equal to or larger than the peak-to-peak amplitude of the rf, thereby preventing the rf voltage swing from affecting the mode of operation of the capacitor 45i.

In keeping with one of the more detailed features of this invention, provision is made for inhibiting inversion of the mesa capacitors 45i and 45j, thereby enabling them to remain effectively fully depleted for prolonged periods of time. As previously pointed out, such devices tend to experience inversion when they are biased into depletion, so they remain effectively depleted for only a relatively short period of time, as shown in FIG. 6A at $t_0 - t_1$ (the time scale to the left of $t_1$ is expanded to illustrate events occurring within milliseconds). Unfortunately, inversion causes the capacitance of such a device to gradually increase independently of any variation in the bias voltage applied to it, so the capacitive drift soon becomes significant, as at time $t_1$ and thereafter continues to increase (the time scale to the right of $t_1$ is compressed to illustrate events spanning several seconds). Thus, to prevent these unwanted capacitive variations from interfering with the printing of long, continuous strings of white pixels, means are provided for inhibiting inversion of the capacitors 45i and 45j, thereby enabling them to effectively operate in their depletion modes for an extended period of time.

Again, similar provision may be made for each of the capacitors 45i and 45j, so the inversion inhibiting means for the capacitor 45i are shown in FIG. 3 to provide a generally representative example. As will be seen, to inhibit inversion of the capacitor 45i, the control circuitry for the droplet ejector 23i includes a second gate 51i which is cyclically enabled and disabled by a second phase (clock $\Phi_2$) of the clock pulse source (not shown), thereby periodically superimposing positive going ($+V_3$) refresh pulses on the negative bias voltage, $-V_2$ for the capacitor 45i. The magnitude of these positive refresh pulses is greater than the magnitude of the negative bias voltage, $-V_2$, so they periodically reverse the bias that is applied to the capacitor 45i while it is operating in its depletion mode, As indicated in FIG. 6B, this periodic "refresh" of the depletion mode of operation of the capacitor 45i precludes it from experiencing a significant inversion, thereby enabling it to remain more or less fully depleted for an indefinitely long period of time.

Figure 7A:
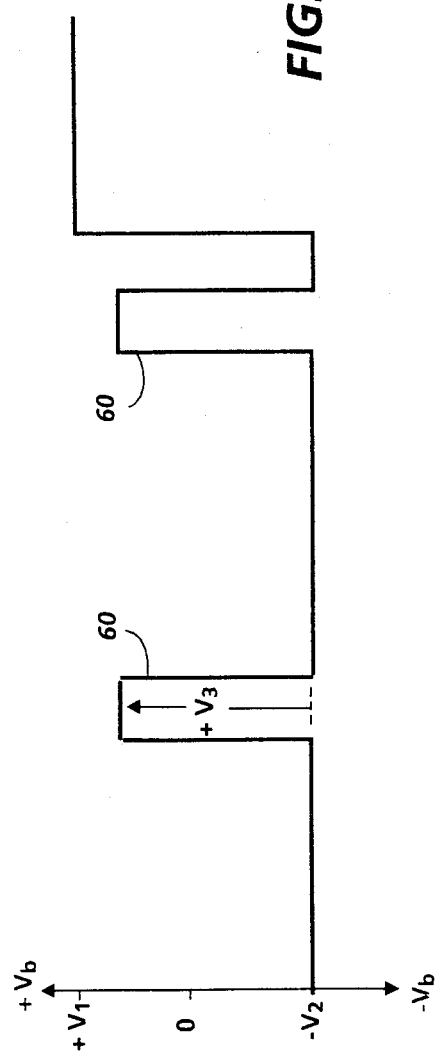
FIGS. 7A and 7B are timing diagrams illustrating the operation of the rf modulator shown in FIGS. 3 and 4.
Figure 7B:
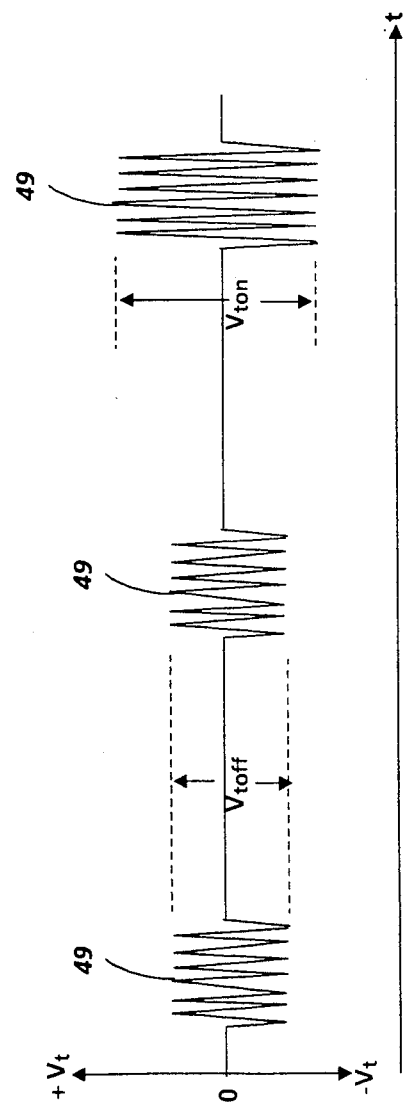

As will be appreciated, the capacitor 45i may suffer temporary capacitive variations while its bias is being reversed. However, as indicated in FIGS. 7A and 7B, a predetermined anti-phase relationship is maintained between the operation of the rf gate 46 and the refresh gate 51i to confine the refresh ($+V_3$) pulses 60 (FIG. 7A) and any capacitive variations they cause to the intervals between successive rf bursts 49 (FIG. 7B). Indeed, clock $\Phi_1$ and clock $\Phi_2$ suitably are opposite phases of a dual phase clock or the like, whereby the gates 46 and 51i are enabled and disabled in synchronous phase opposition with respect to each other, thereby ensuring a non-overlapping time staggering of the rf bursts and the refresh pulses.

In accordance with still another feature of this invention, more or less standard large area amorphous silicon fabrication techniques can be utilized for vertically integrating the mesa capacitors 45i and 45j with the printhead 22. For example, as illustrated in FIGS. 3 and 4, the integration may be carried out by first depositing a suitably thick film 61 of dielectric material, such as $Si_3N_4$, on the patterned metallization of the transducer 39 (i.e., the metallization defining its individually addressable electrodes 41i and 41j). Following that, a sufficiently thick film 62 of aSi is deposited on the dielectric film 61, and then a thinner film 63 of n+ aSi doped with a suitable dopant, such as phosphorous, is deposited on the aSi film 62. Thereafter, the aSi film 62 and its n+ interface layer 63 are patterned to form individual mesas in substantial vertical alignment with the electrodes 41i and 41j, with the area of these mesas being selected to tailor the capacitive characteristics of the capacitors 45i and 45j and typically being somewhat less than the area of the electrodes 41i and 41j. To complete the fabrication, a metallization 64 is deposited on the patterned interface layer 63, and then still another patterning step is performed to generally conform the metallization 64 to the interface layer 63.

Figure 8A:
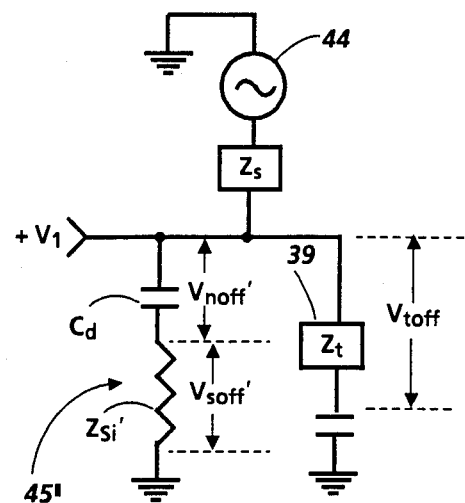
FIGS. 8A and 8B are single channel accumulation and depletion mode models, respectively, of a shunt connected alternative to the series connected modulator shown in FIGS. 3 and 4.
Figure 8B:
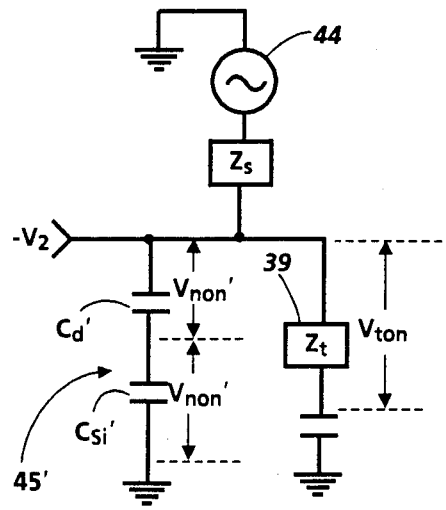
Figure 9A:
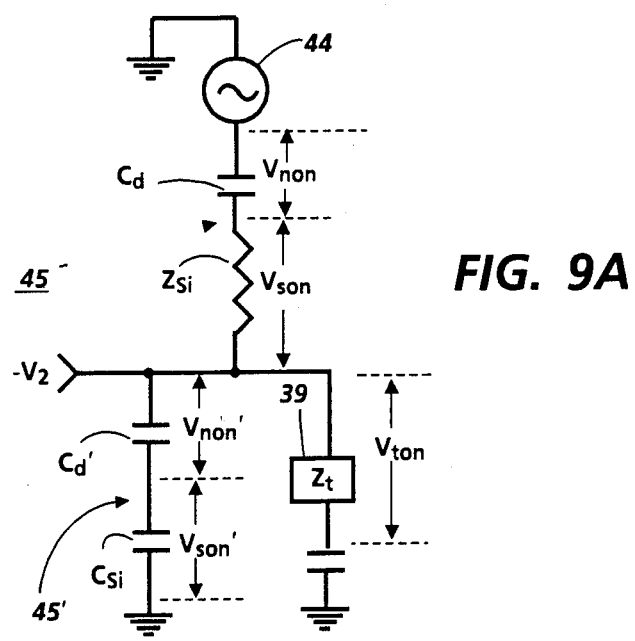
FIGS. 9A and 9B are single channel models of a series/shunt configuration of this invention.
Figure 9B:
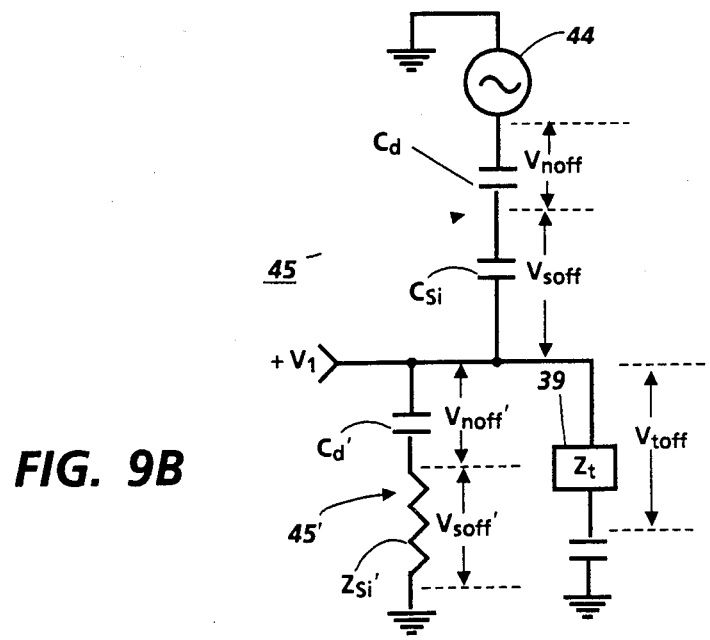

As a result of the above-described vertical integration process, the varactors 45i and 45j share the electrodes 41i and 41j, respectively, with the transducer 39 and are connected in series with the transducer 39 in its rf ground return path. Nevertheless, it will be evident that the varactors 45i and 45j could be discrete devices or hybrid integrated elements and could be coupled to the transducer 39 and the rf supply 44 in a variety of different ways, without departing from the broader thrust of this invention. For example, as shown in FIGS. 8A and 8B, the varactors may be coupled across the rf source 44 and a suitable load impedance $Z_s$ in parallel with the transducer 39, as at 45i', with the basic distinction being that the amplitude of the rf applied to the transducer means of a given droplet ejector will then decrease and increase as the varactor for that ejector is switched between its accumulation mode and its depletion mode, respectively. Likewise, as shown in FIGS. 9A and 9B, it will be understood that the depth of the amplitude modulation that is produced can be enhanced by providing both a series varactor 45ii and a shunt varactor 45i' for the transducer means for each of the droplet ejectors. The speed of response required of the varactors to changes in the bias applied across them is relatively modest (approximately 10 $\mu$secs.), regardless of whether the varactors are series connected (FIGS. 5A and 5B), shunt connected (FIGS. 8A and 8B, or in a series/shunt configuration (FIGS. 9A and 9B, because they need only be able to switch between their accumulation and depletion modes at the rf modulation rate, which typically is on the order of 100 KHz or so.

CONCLUSION

In view of the foregoing, it will now be apparent that present invention provides relatively simple and inexpensive aSi varactors for amplitude modulating rf signals, such as for acoustic ink printing. Furthermore, it will be evident that generally conventional large area fabrication processes may be utilized to vertically integrate these varactors with acoustic ink printheads, as well as to fabricate integrated arrays of them for assembly with such printheads or similar rf devices using standard interconnect technology, such as wire bonds (not shown).

What is claimed:

1. The combination comprising
   an rf voltage source;
   an electrical load;
   at least one aSi capacitor coupled to said load and to said source; and
   control means coupled to said capacitor for applying a variable polarity bias to it for switching said capacitor between an accumulation mode and a depletion mode in response to different binary states of a time varying input signal, whereby the rf voltage applied to said load is amplitude modulated in accordance with said input signal.

2. The combination of claim 1 wherein
   said control means further includes means for periodically reversing the bias applied to said mesa capacitor while it is operating in its depletion mode, thereby inhibiting it from entering into an inversion mode.

3. The combination of claim 1 wherein
   said load is a piezoelectric transducer means for driving a droplet ejector of an acoustic ink printer; and
   said input signal is a serial stream of data samples representing pixels of an image.

4. The combination of claim 1 wherein
   said control means biases said capacitor into a capacitively saturated accumulation mode for the printing pixels of one type and into a capacitively saturated depletion mode for the printing of pixels of an opposite type; and
   said control means further includes means for periodically reversing the bias applied to said capacitor during the printing of continuous strings of said opposite type pixels, thereby inhibiting said capacitor from entering into an inversion mode.

5. The combination comprising
   an rf voltage source;
   an electrical load;
   at least one voltage controlled capacitive device coupled to said load and to said source, with said capacitive device being vertically integrated with said load; and
   control means coupled to said capacitive device for applying a variable polarity bias to it for switching it between an accumulation mode and a depletion mode in response to different binary states of a time varying input signal, whereby the rf voltage applied to said load is amplitude modulated in accordance with said input signal.

6. The combination of claim 5 wherein
   said capacitive device is an aSi capacitor.

7. In combination with an acoustic ink printer including a supply of liquid ink with a free surface, a printhead having at least one droplet ejector, and an rf source; said droplet ejector including a piezoelectric transducer means, with said rf source being coupled across said transducer means for exciting it into oscillation to cause said droplet ejector to launch a converging acoustic beam into said ink such that said beam impinges upon and exerts an acoustic radiation pressure against said free surface; the improvement comprising
   at least one aSi capacitor coupled to said rf source and to said transducer means; and
   control means coupled to said capacitor for applying a variable polarity bias to it for switching it between a first capacitance level in response to data samples representing black pixels and a second capacitance level in response to data samples representing white pixels, whereby the rf applied to said transducer means is amplitude modulated to vary the radiation pressure said acoustic beam exerts against the free surface of said ink between a level at least equal to an ejection threshold pressure level for the printing of black pixels and a lower, sub-threshold level for the printing of white pixels.

8. The improvement of claim 7 wherein
   said aSi capacitor is vertically integrated with said droplet ejector, and
   said control means switches said capacitor between a substantially capacitively saturated accumulation mode and a substantially capacitively saturated depletion mode for the printing of said black and white pixels.

9. The improvement of claim 8 further including
   first gate means coupled between said rf source and said transducer for applying said rf to said transducer in bursts at a predetermined burst rate;
   second gate means for periodically reversing the bias applied to said capacitor by said control means while continuous strings of pixels are being printed with said capacitor in its depletion mode, thereby inhibiting said capacitor from entering into an inversion mode; and
   means for operating said first and second gate means in a time staggered relationship to maintain a non-overlapping relationship between said rf bursts and the reverse bias applied to said capacitor while it is in its depletion mode.

10. The improvement of claim 8 wherein
    said capacitor comprises an intrinsic aSi film, a dielectric film, and a pair of metallizations; said films being in intimate face-to-face contact with each other and being sandwiched between said metallizations; and
    one of said metallizations is an electrode of said piezoelectric transducer.

11. The improvement of claim 10 wherein said printhead comprises a substrate having a posterior face bonded to said transducer means and an anterior face acoustically coupled to said ink, with at least one generally spherical depression being formed in the anterior face of said substrate to provide an acoustic lens for launching said acoustic beam into said ink.

12. The improvement of claim 11 wherein
said rf is applied to said transducer in bursts at a predetermined burst rate; and
said control means further includes means for periodically reversing the bias applied to said mesa capacitor while continuous strings of pixels are being printed with said capacitor is operating in its depletion mode, whereby said capacitor is inhibited from entering into an inversion mode.

13. The improvement of claim 7 wherein
said capacitor is coupled in series between said source and said transducer means.

14. The improvement of claim 13 further including
another aSi capacitor is coupled in parallel with said source.

15. The improvement of claim 7 wherein
said capacitor is coupled across said source in parallel with said transducer means.

16. In combination with an acoustic ink printer including an supply of liquid ink with a free surface, a printhead having at lease one droplet ejector, and an rf source; said droplet ejector including a piezoelectric transducer means, with said rf source being coupled across said transducer means for exciting it into oscillation to cause said droplet ejector to launch a converging acoustic beam into said ink such that said beam impinges upon and exerts an acoustic radiation pressure against said free surface; the improvement comprising
at least one voltage controlled semiconductor varactor vertically integrated with said droplet ejector, said varactor being coupled to said source and to said transducer means; and
control means coupled to said varactor for applying a variable polarity bias to it for switching it between a first capacitance level in response to data samples representing black pixels and a second capacitance level in response to data samples representing white pixels, thereby modulating the radiation pressure said acoustic beam exerts against the free surface of said ink between a level at least equal to an ejection threshold pressure level for the printing of black pixels and a lower, subthreshold level for the printing of white pixels.

17. The improvement of claim 16 wherein
said varactors are aSi capacitors.

18. The improvement of claim 17 wherein
said transducer means are individually addressable centers of a piezoelectric element which is deposited on the posterior face of said substrate, and
said aSi capacitors comprise a patterned dielectric film which is deposited on said piezoelectric element, and a patterned intrinsic aSi film which is deposited on and in intimate face-to-face contact with said dielectric film, with the patterning of said films being selected to substantially center said capacitive devices on the individually addressable centers of said piezoelectric element.

19. In an acoustic ink printer having a plurality of droplet ejectors for ejecting droplets of ink on command from a free surface of a supply of liquid ink, each of said droplet ejectors having a piezoelectric transducer means, and said printer having an rf source which is coupled across said transducer means to excite them into oscillation; the improvement comprising
at least one aSi capacitive varactor associated with each of said droplet ejectors, with each varactor being being coupled to said source and to the transducer means of its associated droplet ejector; and
control means coupled to said varactors for applying variable biases to them in response to data samples representing pixels that are to be printed by their associated droplet ejectors, whereby said varactors amplitude modulate the rf applied to the transducer means of their associated droplet ejectors in accordance with said data samples.

20. The improvement of claim 19 wherein
said droplet ejectors comprise acoustic focusing lenses which are formed on preselected centers in the anterior face of a substrate composed of a material having an acoustic velocity that is substantially higher than that of said ink, the anterior face of said substrate being acoustically coupled to said ink;
said transducer means are intimately bonded to a posterior face of said substrate in acoustic alignment with the acoustic lenses of their respective droplet ejectors, whereby the oscillation of said transducer means acoustically illuminates said lenses such that they launch converging acoustic beams into said ink for propagation in a direction that causes each of said beams to be incident on and to exert a modulated radiation pressure against the free surface of said ink; and
the radiation pressure of each of said beams is modulated between a level at least equal to a predetermined droplet ejection threshold level for the printing of black pixels and a lower, subthreshold level for the printing of white pixels.

* * * * *